United States Patent
Huber et al.

(10) Patent No.: US 9,841,474 B2
(45) Date of Patent: Dec. 12, 2017

(54) METHOD AND DEVICE FOR CONTROLLING A SIGNAL WITH A PLURALITY OF INDEPENDENT COMPONENTS

(75) Inventors: Klaus Huber, Effeltrich (DE); Clemens Jungkunz, Erlangen (DE); Sebastian Martius, Forchheim (DE); Martin Nisznansky, Möhrendorf (DE); Markus Vester, Nürnberg (DE)

(73) Assignee: Siemens Aktiengesellschaft, Münich (DE)

( * ) Notice: Subject to any disclaimer, the term of this patent is extended or adjusted under 35 U.S.C. 154(b) by 796 days.

(21) Appl. No.: 13/221,652

(22) Filed: Aug. 30, 2011

(65) Prior Publication Data

US 2012/0224647 A1   Sep. 6, 2012

(30) Foreign Application Priority Data

Aug. 31, 2010 (DE) ................. 10 2010 035 918

(51) Int. Cl.
*H04L 27/00* (2006.01)
*G01R 33/36* (2006.01)

(52) U.S. Cl.
CPC ................. *G01R 33/3607* (2013.01)

(58) Field of Classification Search
USPC .......................................................... 700/19
See application file for complete search history.

(56) References Cited

U.S. PATENT DOCUMENTS 4,963,831 A * 10/1990 Stuivenwold et al. ....... 329/318
5,400,247 A *  3/1995 He ....................... D21G 9/0009
                                                    162/262
(Continued)

FOREIGN PATENT DOCUMENTS

DE    195 01 077 A1    7/1996
DE    101 63 339 A1    7/2003
(Continued)

OTHER PUBLICATIONS

German Office Action dated Apr. 6, 2011 for corresponding German Patent Application No. DE 10 2010 035 918.1-35 with English translation.

*Primary Examiner* — Miranda Huang
*Assistant Examiner* — John Park
(74) *Attorney, Agent, or Firm* — Lempia Summerfield Katz LLC

(57) ABSTRACT

A method for controlling a signal with a plurality of independent components is provided. The signal is fed as an input signal via an input path to a control path that supplies an output signal. The output signal is fed via an output path to a control apparatus controlling the input signal. A coupling signal is determined in a coupling determination apparatus. On the basis of the coupling signal, the independent components are decoupled in a decoupling apparatus, as a result of which, a decoupled output signal is generated. Components of the decoupled output signal are decoupled from the components of the input signal. The decoupled output signal is fed as a control variable to the control apparatus. The control apparatus controls each independent component separately on the basis of a desired signal with a diagonal controller and outputs the input signal as a manipulated variable.

16 Claims, 1 Drawing Sheet

(56) References Cited

U.S. PATENT DOCUMENTS

| | | | |
|---|---|---|---|
| 6,801,037 B1* | 10/2004 | Zhang | 324/309 |
| 2002/0065048 A1* | 5/2002 | Nagatani et al. | 455/63 |
| 2006/0004470 A1 | 1/2006 | Lietzau | |
| 2007/0222449 A1* | 9/2007 | Hoult | 324/318 |
| 2008/0158640 A1* | 7/2008 | Watanabe et al. | 359/239 |
| 2008/0159362 A1* | 7/2008 | Gelbman et al. | 375/219 |
| 2009/0058714 A1* | 3/2009 | Vacanti | 342/120 |
| 2009/0060381 A1* | 3/2009 | Dunki-Jacobs | 382/275 |
| 2010/0036211 A1* | 2/2010 | La Rue et al. | 600/301 |
| 2010/0098195 A1* | 4/2010 | Nekhamkin et al. | 375/344 |

FOREIGN PATENT DOCUMENTS

| | | |
|---|---|---|
| DE | 102 46 910 A1 | 5/2004 |
| WO | WO 2007/090220 A1 | 8/2007 |

\* cited by examiner

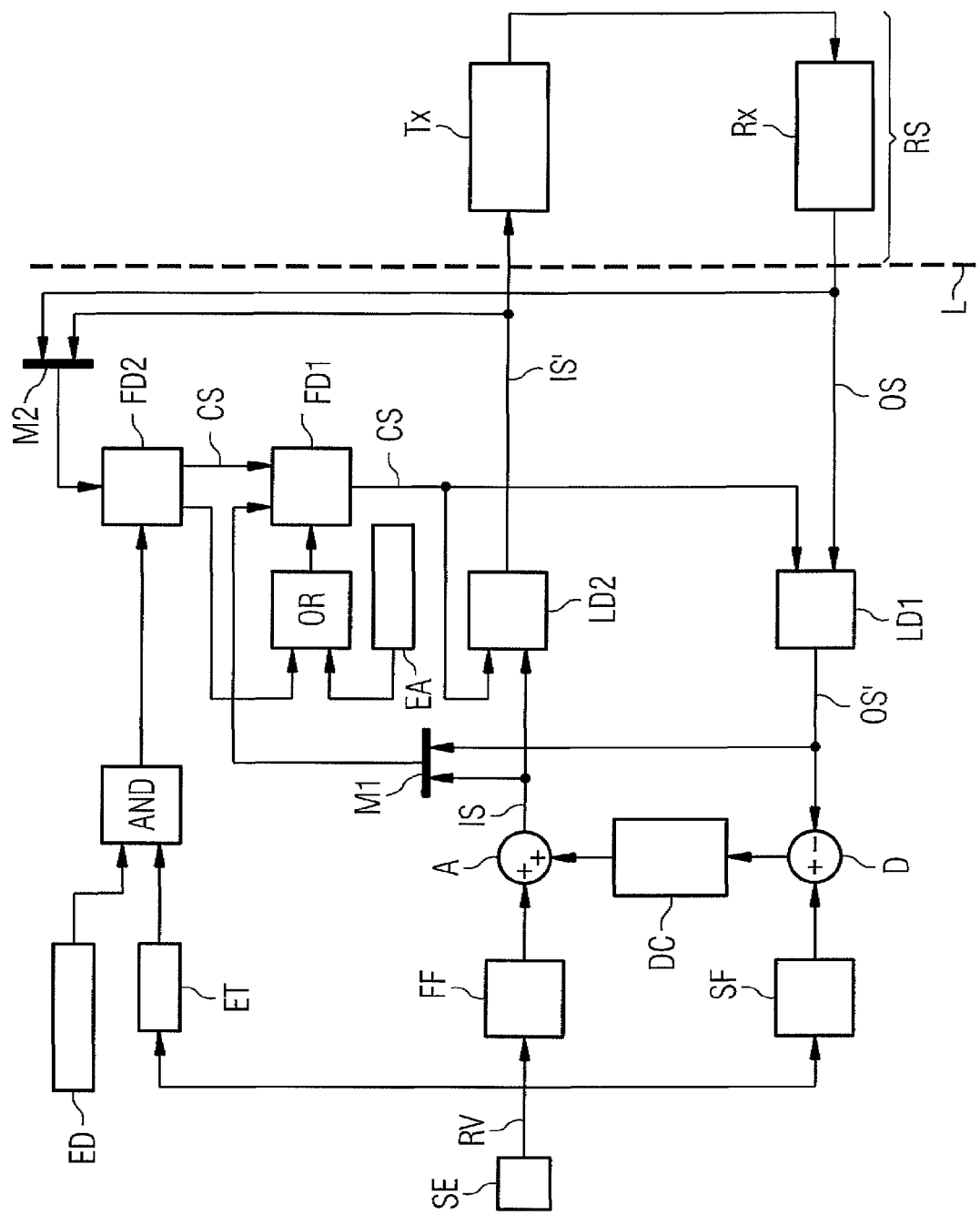

METHOD AND DEVICE FOR CONTROLLING A SIGNAL WITH A PLURALITY OF INDEPENDENT COMPONENTS

This application claims the benefit of DE 10 2010 035 918.1, filed on Aug. 31, 2010.

BACKGROUND

Signals including multiple independent, separately adjustable components may be controlled in control systems, where the adjustment of a component has no effect on other components. The components (e.g., Cartesian or orthogonal components) undergo a change as a result of a control path. For example, couplings between the individual exposure pathways of the independent components may occur at the control path. This results in a considerable amount of extra work when designing the corresponding control system architecture. This may include dynamic damage to the control loop. For example, the control loop may, in some circumstances, no longer be stable, or may at least become dynamically unusable. This type of situation is to be detected for such control loops, following which a total shutdown of the control process is initiated.

SUMMARY AND DESCRIPTION

The present embodiments may obviate one or more of the drawbacks or limitations in the related art. For example, a stable and dynamic control process for a signal with a plurality of independent components may be provided.

In one embodiment of a method for controlling a signal with a plurality of independent components, the signal to be controlled is fed as an input signal via an input path to a control path. The control path supplies an output signal that is fed via an output path to a control apparatus controlling the input signal. The input path, for example, specifies a path from a location of the generation of the input signal through to a corresponding input at the control path. Analogously, an output path specifies a path from the output of the control path through to the input of the control apparatus.

In one embodiment of the method, a coupling signal is determined in a coupling determination apparatus. The coupling signal represents the coupling induced by the control path between different components of the input signal and the output signal. The coupling is contained in the output signal of the control path. Based on the coupling signal, the independent components are decoupled in a decoupling apparatus, as a result of which a decoupled output signal is generated. Components of the decoupled output signal are each decoupled from other components of the input signal. The decoupled output signal is fed to the control apparatus as a control variable, where the control apparatus uses a diagonal controller to control each independent component separately on the basis of a desired signal and outputs the input signal as a manipulated variable.

In one embodiment, the method is characterized in that the output signal is not fed to the control apparatus without preprocessing, but undergoes a decoupling so that the components of the signal are again decoupled from one another. The control path supplemented by the decoupling acquires diagonal shape. The advantage of this is that a diagonal controller may be used for control, the matrix of which contains entries only along the diagonal. As a result, a simple control process structure that is still highly dynamic may be achieved.

In one embodiment, in order to efficiently determine the coupling signal, a signal transmitted via the input path and a signal transmitted via the output path are compared in the coupling determination apparatus. Since the coupling is contained in a difference between the signal transmitted via the input path and the signal transmitted via the output path, the coupling may easily be determined using known methods and may be taken into account appropriately during the decoupling.

In one embodiment, dynamic changes in the control path are also taken into account. This is achieved in that continuously or regularly during the control process, the coupling signal is determined using a first coupling determination unit of the coupling determination apparatus and is used for decoupling. Alternatively or additionally, the coupling signal may be determined once using a second coupling determination unit of the coupling determination apparatus (e.g., during initialization of the method, or at one or more (irregular) points in time). The points in time, at which the second coupling determination unit is put into service, may be specified (e.g., by a user) or may be set by a trigger signal (e.g., on the basis of a desired signal fed to the control process).

In one embodiment, a signal transmitted via the input path (e.g., the input signal at the start of the input path and the decoupled output signal at the end of the output path) is fed to the coupling determination apparatus. The coupling determination apparatus determines the coupling signal from the signal transmitted via the input path. At the time of initialization of the method, the decoupled output signal, for example, still corresponds to the coupled output signal, since no coupling signal has yet been determined. The determination of the coupling signal is, for example, based on an updating of the present coupling signal, where the present coupling signal changes after the updating only if there are changes in the coupling along the control path. The signals referred to may be fed to the first coupling determination unit described above. The first coupling determination unit may continuously update the coupling signal on the basis of corresponding updatings.

In one embodiment, a signal transmitted via the input path (e.g., the signal at the end of the input path and the (coupled) output signal at the start of the output path) is fed to the coupling determination apparatus. The coupling determination apparatus determines the coupling signal from the signal transmitted via the input path. The signal at the end of the input path and the output signal at the start of the output path are fed to the second coupling determination unit described above in order, at particular points in time (e.g., during initialization of the method), to calculate the coupling signal completely separate from the coupled output signal.

In one embodiment, in order to implement the decoupling, the coupling signal is fed to a first decoupling unit (e.g., arranged in the output path) of the decoupling apparatus. The first decoupling unit determines the decoupled output signal from the coupling signal. In order to take appropriate account of nonlinearities at an input of the control path, a second decoupling unit arranged in the input path may optionally be provided in addition to the first decoupling unit. The coupling signal is further fed to the second decoupling unit, which determines a decoupled input signal from the coupling signal. The decoupled input signal resides at the input of the control path.

In one embodiment, a complex-valued signal having a real part and an imaginary part is described by the input signal, the real part and the imaginary part each representing an independent Cartesian component of the signal to be controlled.

The method of the present embodiments may be used in different technical fields, in which control paths that result in a coupling of independent components occur. In one embodiment, the method is used in the field of generation of high-frequency signals. The control path includes a transmit unit for emitting a high-frequency signal and a receive unit for receiving the high-frequency signal emitted via the transmit unit. Transmit units in high-frequency technology may contain processing units in the form of high-frequency amplifiers, modulation apparatuses and similar devices. These apparatuses are subject to a certain dynamic (e.g., the attributes of high-frequency amplifiers change when the operating temperature changes). The dynamic changes may be compensated for quickly and efficiently with the method of the present embodiments, so that a constant high-frequency signal is generated by the transmit unit. The transmit unit may, for example, be a transmit unit for a nuclear spin tomography system. The transmit unit generates high-frequency pulses for the resonant excitation of atomic nuclei in human or animal tissue in order to generate images of the tissue in a suitable fashion.

When using the method of the present embodiments in the control path, the input signal is, for example, a baseband signal with a significantly lower frequency than the generated high-frequency signal. The baseband signal is modulated and emitted in the transmit unit with a high-frequency carrier signal. The baseband signal may also be amplified. The modulated high-frequency signal received in the receive unit is demodulated and may also be amplified.

Besides the method described above, a device for controlling a signal having a plurality of independent components may also be provided. The device includes a control apparatus. When the device is in service, the signal to be controlled is fed as an input signal via an input path to a control path. The control path supplies an output signal that is fed via an output path to the control apparatus controlling the input signal. One embodiment of the device contains a coupling determination apparatus for determining a coupling signal. The coupling signal represents a coupling induced by the control path between different components of the input signal and the output signal. In addition, a decoupling apparatus for decoupling the independent components on the basis of the coupling signal is provided, as a result of which an output signal is generated. Components of the output signal are decoupled from each of the components of the input signal. The control apparatus is configured such that the control apparatus receives the decoupled output signal as a control variable and, using a diagonal controller, controls each independent component separately on the basis of a desired signal and outputs the input signal as a manipulated variable.

The device is, for example, configured such that one or more of the variants of the method described above may be implemented with the device.

BRIEF DESCRIPTION OF THE DRAWINGS

FIG. 1 shows a diagrammatic representation of one embodiment of a control process for controlling a signal with a plurality of independent components.

DETAILED DESCRIPTION OF THE DRAWINGS

In the following, the present embodiments are described using the example of a control process for a signal for a high-frequency transmit unit. The high-frequency transmit unit is, for example, a corresponding transmitter Tx, to which a baseband signal IS' is fed. The transmitter Tx amplifies the baseband signal IS' using a high-frequency amplifier and modulates the baseband signal IS' with a high-frequency carrier signal that lies in the range between one and several hundred megahertz (e.g. 120 MHz). A maximum frequency of the baseband signal is, for example, approximately 500 kHz. The transmitter Tx is a transmitter used in a nuclear spin tomography system, for example, and transmits high-frequency pulses to excite atoms in a human body or an animal body in order, in combination with a corresponding magnetic field, to generate images of the body.

Because of changes in the transmitter that may not be influenced (e.g., caused by a change in an amplification behavior of the high-frequency amplifier as a result of temperature fluctuations), the emitted high-frequency signal is subject to undesired fluctuations, resulting in errors with respect to the imaging performed by the tomography system. In order to counter the errors, one embodiment of a control process, as described below, is used. The high-frequency signal generated by the transmitter Tx is received by a corresponding high-frequency receive unit Rx that amplifies the high-frequency signal and demodulates the high-frequency signal as appropriate, so that a demodulated baseband signal is received as an output signal OS. Due to the transmit unit Tx, the receive unit Rx, and a signal transmission path between the transmit unit Tx and the receive unit Rx, a control path RS that lies on the right-hand side of vertical dashed line L in FIG. 1 is created.

With one embodiment of the control process in FIG. 1, a two-variable control process for the baseband signal is created. The baseband signal includes a real part and an imaginary part as independent Cartesian components (e.g., two Cartesian components) to be controlled. In the complex number range, the two Cartesian components describe an amplitude and a phase of the baseband signal. The two Cartesian components may, for example, be adjusted independently of one another, but are coupled to one another by the control path RS. In a control process, the real part and the imaginary part of the baseband signal may not be controlled separately, since there is interference between the real part and imaginary part. Conventionally, a 2×2 matrix with non-diagonal elements not equal to zero is used in the control process in order to take account of the coupling between the real part and the imaginary part. This results in a controller with a complex structure with four control deviations. The complexity of the controller increases quadratically with the number of Cartesian components controlled. According to the present embodiments, a control process, in which a diagonal controller with a simple structure may be used despite the coupling of the Cartesian components via the control path RS, is provided. This is achieved by an appropriate decoupling of the Cartesian components coupled via the control path RS, as described in the following.

As part of the control process, a desired or reference value RV (e.g., a reference signal), on which the baseband signal is to be controlled, is generated using a setup device SE. The desired or reference value RV is fed to an (optional) precontroller in the form of a feed-forward controller FF that adjusts the baseband signal to the high-frequency amplifier in the transmit unit Tx. A precontrol signal arrives at an adder A, in which the precontrol signal is additively coupled with an output of a diagonal controller DC. The reference signal RV is further fed to an (optional) setup filter SF. The setup filter SF, in the control process, takes account of a corresponding dead time that is caused by a time lag during the signal transmission or signal generation via the control path RS. With the aid of the setup filter SF, a signal that is time-congruent to the signal OS' is generated using the dead time. The time-congruent signal is coupled with the signal of the setup filter SF via a subtractor D. A resulting difference signal is fed to the diagonal controller DC.

To be able to use the diagonal controller DC, a corresponding decoupling of the Cartesian components coupled via the control path RS is performed. This is achieved in the device in FIG. 1 by two coupling determination units FD1 and FD2 and two decoupling units LD1 and LD2. The coupling between the Cartesian components is continuously determined via the coupling determination unit FD1 as part of the control process, and a coupling signal CS based on the coupling is continuously generated or adjusted. The coupling signal represents, for example, a phase shift between the signals before and after the control path RS. To determine the coupling, an input signal IS is fed to the coupling determination unit FD1. The input signal IS is received (e.g., formed) in the adder A by the addition of the output signal of the diagonal controller to the precontrol signal and represents a manipulated variable of the control loop. As a further signal, the coupling determination unit FD1 is fed the output signal OS', which originates from the decoupling unit LD1 described below. The two signals (e.g., the input signal IS and the output signal OS') are combined in a signal combiner M1 that routes the combined signal to an input of the coupling determination unit FD1. The coupling is, for example, determined in the coupling determination unit FD1 by comparing the combined signals, which results in a coupling signal CS at an output of the coupling determination unit FD 1.

In addition to the coupling determination unit FD1, a further (optional) coupling determination unit FD2 is used in FIG. 1. The further coupling determination unit FD2 unit, unlike the coupling determination unit FD1, is not used for continuous correction of the coupling signal CS, but instead supplies, on a one-off basis or at predetermined points in time (e.g., triggered by a corresponding trigger), an updated coupling signal CS that is looped via the coupling determination unit FD1 and arrives at the decoupling unit LD1. In one embodiment, the coupling determination unit FD2 may be used at the start of the control process in order to perform an immediate identification of the coupling, so that the controller is activated faster. The coupling determination unit FD2 is fed the baseband signal IS' at an input of the control path RS and the coupled output signal OS at an output of the control path RS via a further signal combiner M2. By comparing the combined signals, the further coupling determination unit FD2 determines the coupling signal CS. Both the coupling determination unit FD1 and the further coupling determination unit FD2 determine the coupling signal on the basis of a feedback decoupling.

By way of example, FIG. 1 shows a variant for how the further coupling determination unit FD2 may be put into service. The further coupling unit FD2 is, for example, activated via an output of an AND gate, where if a logical 1 resides at an AND gate output, the further coupling determination unit FD2 is activated and determines a corresponding coupling signal CS. So that a logical 1 is generated at the output of the AND gate, function units (e.g., an enable by trigger (ET) function unit and an enable on demand (ED) function unit) have a logical 1 at inputs (e.g., both inputs) of the AND gate. The function unit ET, for example, generates a logical 1 whenever the function unit ET is fed a sufficient desired value level via unit SE. Using the function unit ET, the function unit FD1 may be put into service using a trigger signal if in addition to a sufficient desired value level, a logical 1 is generated by the function unit ED.

In FIG. 1, the use of the coupling determination unit FD1 is controlled via a corresponding OR gate. When a logical 1 resides at an output of the OR gate, the further coupling determination unit FD2 is put into service. The logical OR gate, for example, generates a logical 1 if a logical 1 resides at at least one input of the logical OR gate. An input is, for example, fed through an enable always (EA) function unit, with which it is provided that the further coupling determination unit FD2 is put into service by the generation of a corresponding logical 1. If a logical 0 is generated by the function unit EA, the entry into service of the coupling determination unit FD1 is controlled via a corresponding output signal from the further coupling determination unit FD2. In one embodiment, a logical 1 is generated by the further coupling determination unit FD2 whenever the further coupling determination unit FD2 is not in service, so that the coupling is updated by the coupling determination unit FD1.

The determination of the coupling signal CS on the basis of the coupling determination unit FD1 or the further coupling determination unit FD2 is followed by the actual decoupling in the decoupling units LD1 or LD2 (e.g., a loop decoupler) that represent loop decouplers (LD). The individual decoupling units LD1 and LD2 implement a corresponding rotational matrix, with which a phase shift specified in the coupling signal is reversed. The loop decoupler LD1 represents a component of the control process in FIG. 1, where the loop decoupler LD2 is an optional component. The decoupler LD1 is, for example, fed the coupled output signal OS from the control path RS and the coupling signal CS. Based on the known coupling, a decoupled output signal OS' may be determined in the decoupler. A real part and an imaginary part of the decoupled output signal OS' are decoupled. A decoupling may also be effected on the input side via the decoupler LD2, where the input signal IS and the coupling signal CS are fed to the decoupler LD2. The decoupler LD2 determines the baseband signal IS' (e.g., a decoupled input signal). The decoupler LD2 is, for example, used if nonlinearities that cannot be sufficiently taken into account merely by decoupling on the output side occur on the input side of the control path RS.

Based on a corresponding decoupling by the decoupler LD1 and the decoupler LD2, the decoupled output signal OS' is received in total and is combined with the desired value via the subtractor. Since a signal with a decoupled real and imaginary part resides at the input of the controller DC, both Cartesian components may be controlled separately via a diagonal controller, the matrix of which contains components only along the diagonal. The diagonal controller corresponds, for example, to a combination of two separate single-variable controllers. A diagonal controller of this type is significantly simpler in design than controllers, in which couplings are to be processed between the components of the control variable.

The control process described above has a number of advantages. For example, the Cartesian components of the actuating signal may be coupled to one another for a control path, and a simple control process with a diagonal controller may be achieved by using a corresponding decoupling. This decoupling provides that the thereby obtained cumulative effect paths no longer have any coupling. The control process is, for example, significantly simpler in design and implementation and simultaneously is more dynamic in performance. In one embodiment, the decoupling may be implemented continuously by updating the correspondingly determined coupling signal in order to take account of dynamic changes in the control path. In one embodiment, if necessary, the coupling signal may be recalculated only during initialization of the method or at dedicated points in time. Both variants may also be combined with one another.

The method of the present embodiments is described on the basis of the control process of a high-frequency transmit unit for a nuclear spin tomography system. In a nuclear spin tomography system, a plurality of transmit units that work on different channels may be used. According to the present embodiments, a corresponding control process of the present embodiments may be implemented for each of the transmit units. The method is additionally not limited to the use of transmit units in nuclear spin tomography systems. The method may also be used in other technical fields, in which an actuating signal is coupled to a plurality of independent components via a control path. A further area of application is, for example, the control process for electric drives in a.c. machines, where the torque-generating current and the field-generating current are to be influenced separately from one another as independent components.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for controlling a signal with a plurality of independent components, wherein the signal is fed as an input signal via an input path to a control path, the control path comprising a transmitter for a nuclear spin tomography system and supplying an output signal that is fed via an output path to a control apparatus controlling the input signal, the method comprising:
   determining, in a coupling determination apparatus, a coupling signal that represents a coupling between different components of the input signal and the output signal induced by the control path;
   decoupling, in a decoupling apparatus, the plurality of independent components on the basis of the coupling signal, the plurality of independent components being Cartesian components comprising a real part and an imaginary part, wherein a decoupled output signal is generated as a result of the decoupling, components of the decoupled output signal being decoupled from components of the input signal; and
   feeding the decoupled output signal to the control apparatus as a control variable, wherein the control apparatus, with a diagonal controller, controls each independent component of the plurality separately on the basis of a desired signal and outputs the input signal as a manipulated variable,
   wherein the input signal transmitted via the input path is fed to the coupling determination apparatus,
   wherein the coupling determination apparatus determines the coupling signal from the input signal transmitted via the input path, and
   wherein determining the coupling signal comprises comparing, in the coupling determination apparatus, the input signal transmitted via the input path and the output signal transmitted via the output path.

2. The method as claimed in claim 1, wherein the coupling signal is continuously determined during the control process using a first coupling determination unit of the coupling determination apparatus and is configured for decoupling the plurality of independent components.

3. The method as claimed in claim 2, wherein on a one-off basis or at one or more points in time, the coupling signal is determined using a second coupling determination unit of the coupling determination apparatus and is configured for decoupling the plurality of independent components.

4. The method as claimed in claim 1, wherein the input signal transmitted via the input path is fed to the coupling determination apparatus, which determines the coupling signal from the transmitted input signal.

5. The method as claimed in claim 1, wherein the coupling signal is fed to a first decoupling unit of the decoupling apparatus, the first decoupling unit determining the decoupled output signal from the coupling signal.

6. The method as claimed in claim 5, wherein the coupling signal is further fed to a second decoupling unit of the decoupling apparatus, the second decoupling unit determining a decoupled input signal from the coupling signal.

7. The method as claimed in claim 1, wherein the input signal is a complex-valued signal with a real part and an imaginary part, each of the real part and the imaginary part representing an independent Cartesian component.

8. The method as claimed in claim 1, wherein the transmitter is configured to emit a high-frequency signal and the control path further comprises a receiver configured for receiving the high-frequency signal emitted via the transmitter.

9. The method as claimed in claim 8, wherein the input signal is a baseband signal that is modulated with a high-frequency carrier signal in the transmitter and emitted, and
   wherein a received modulated high-frequency signal is demodulated in the receiver.

10. The method as claimed in claim 1, wherein the signal transmitted via the input path comprises the input signal at the start of the input path and the decoupled output signal at the end of the output path.

11. The method as claimed in claim 4, wherein the transmitted input signal comprises a signal at the end of the input path and the output signal at the start of the output path.

12. The method as claimed in claim 5, wherein the first decoupling unit is arranged in the output path.

13. The method as claimed in claim 6, wherein the second decoupling unit is arranged in the input path.

14. A device for controlling a signal with a plurality of independent components, the signal being fed as an input signal via an input path to a control path, the control path comprising a transmitter for a nuclear spin tomography system and supplying an output signal that is fed via an output path to the control apparatus, the device comprising:
   a control apparatus configured to control the input signal;
   a coupling determination apparatus configured for determining a coupling signal, the coupling signal representing the coupling between different components of the input signal and the output signal supplied by the control path, the determination of the coupling signal comprising comparison, in the coupling determination apparatus, of a signal transmitted via the input path and a signal transmitted via the output path; and
   a decoupling apparatus configured for decoupling the plurality of independent components on the basis of the coupling signal, the plurality of independent components being Cartesian components comprising a real part and an imaginary part, a decoupled output signal being generated as a result of the decoupling, components of the decoupled output signal being decoupled from the different components of the input signal, wherein the control apparatus is configured to receive the decoupled output signal as a control variable, controls, with a diagonal controller, each independent component of the plurality separately on the basis of a desired signal, and outputs the input signal as a manipulated variable, wherein the input signal transmitted via the input path is fed to the coupling determination apparatus, and wherein the coupling determination apparatus is further configured to determine the coupling signal from the input signal transmitted via the input path.

15. The method of claim 1, wherein determining a coupling signal that represents a coupling comprises determining a coupling signal that represents a phase shift between the input signal and the output signal.

16. The method of claim 1, wherein the signal transmitted via the output path is the decoupled output signal generated in the decoupling apparatus.

* * * * *